US012547076B2

(12) United States Patent
Matsunaga

(10) Patent No.: US 12,547,076 B2
(45) Date of Patent: Feb. 10, 2026

(54) SUBSTRATE PROCESSING APPARATUS AND SUBSTRATE PROCESSING METHOD

(71) Applicant: Tokyo Electron Limited, Tokyo (JP)

(72) Inventor: Koichi Matsunaga, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 924 days.

(21) Appl. No.: 17/155,586

(22) Filed: Jan. 22, 2021

(65) Prior Publication Data
US 2021/0232050 A1 Jul. 29, 2021

(30) Foreign Application Priority Data

Jan. 24, 2020 (JP) ................. 2020-009763

(51) Int. Cl.
G03F 7/20 (2006.01)
B05D 1/00 (2006.01)
B05D 3/06 (2006.01)
B05D 5/08 (2006.01)
C09D 127/16 (2006.01)
(Continued)

(52) U.S. Cl.
CPC ............ G03F 7/2004 (2013.01); B05D 1/60 (2013.01); B05D 3/061 (2013.01); B05D 5/083 (2013.01); C09D 127/16 (2013.01); G03F 7/167 (2013.01); G03F 7/168 (2013.01); G03F 7/36 (2013.01); G03F 7/38 (2013.01); H01L 21/67017 (2013.01); H01L 21/67225 (2013.01)

(58) Field of Classification Search
None
See application file for complete search history.

(56) References Cited

U.S. PATENT DOCUMENTS

2001/0021486 A1* 9/2001 Kitano ............... G03F 7/16
430/327
2008/0163899 A1* 7/2008 Takiguchi ............... B08B 1/12
134/30
(Continued)

FOREIGN PATENT DOCUMENTS

CN 107256824 A 10/2017
CN 110021546 A 7/2019
(Continued)

OTHER PUBLICATIONS

English Machine translation of Yamamori (WO2018084133A1) retrieved from Espacenet (Year: 2024).*
(Continued)

Primary Examiner — Ram N Kackar
Assistant Examiner — Laureen Chan
(74) Attorney, Agent, or Firm — Nath, Goldberg & Meyer; Jerald L. Meyer; Tanya E. Harkins

(57) ABSTRACT

A substrate processing apparatus includes a hydrophobizing part configured to perform a hydrophobizing process of forming a hydrophobic film on a front surface of a substrate through vapor deposition of a hydrophobizing gas, an ultraviolet radiation part configured to radiate ultraviolet rays to a removal area on a rear surface of the substrate so as to remove the hydrophobic film formed in the removal area in the hydrophobizing process, and a resin-film forming part configured to form a fluororesin film in the removal area after the hydrophobic film is removed.

9 Claims, 13 Drawing Sheets

(51) Int. Cl.
*G03F 7/16* (2006.01)
*G03F 7/36* (2006.01)
*G03F 7/38* (2006.01)
*H01L 21/67* (2006.01)

(56) References Cited

U.S. PATENT DOCUMENTS

2012/0298132 A1* 11/2012 Kawamura ....... H01L 21/02087
 134/1
2018/0025899 A1* 1/2018 Kang ................ H01L 21/67196
 216/89
2021/0223696 A1* 7/2021 Achanta .................. G03F 7/165

FOREIGN PATENT DOCUMENTS

| JP | 63202921 A | * | 8/1988 | | |
| JP | 2016051727 A | * | 4/2016 | | |
| JP | 2019-121683 A | | 7/2019 | | |
| WO | WO-2018084133 A1 | * | 5/2018 | ............... | B08B 7/00 |

OTHER PUBLICATIONS

English Machine translation of Kotaka (JP2016051727A) retrieved from Espacenet (Year: 2024).*
English Machine translation of Yanabe (JPS63202921A) retrieved from Espacenet (Year: 2024).*

* cited by examiner

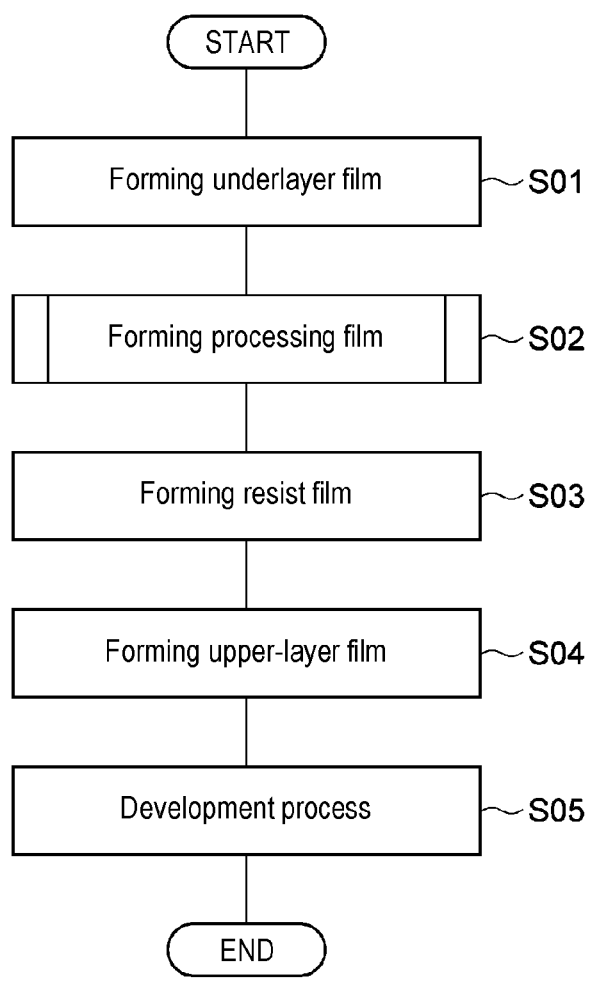

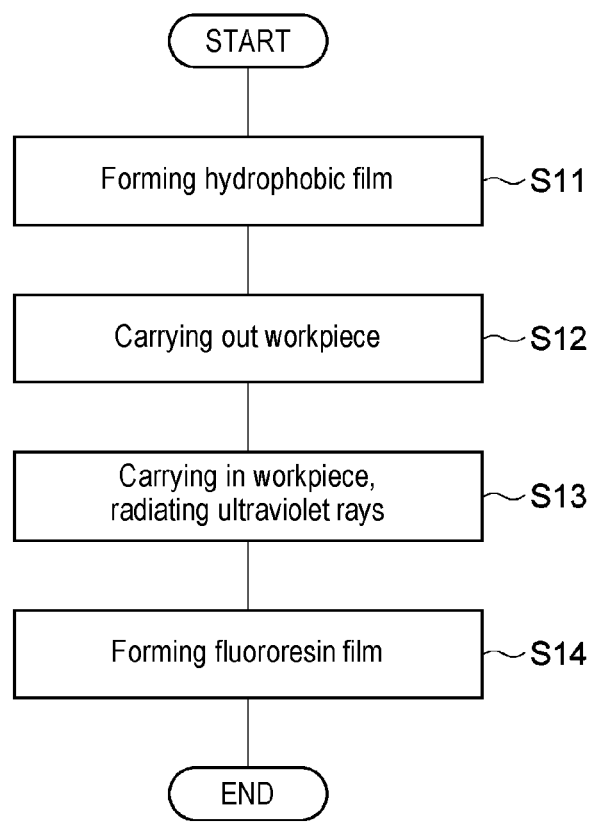

SUBSTRATE PROCESSING APPARATUS AND SUBSTRATE PROCESSING METHOD

CROSS-REFERENCE TO RELATED APPLICATION

This application is based upon and claims the benefit of priority from Japanese Patent Application No. 2020-009763, filed on Jan. 24, 2020, the entire contents of which are incorporated herein by reference.

TECHNICAL FIELD

The present disclosure relates to a substrate processing apparatus and a substrate processing method.

BACKGROUND

Patent Document 1 discloses a substrate processing apparatus including a film forming part configured to form, on the rear surface of a substrate, a friction reducing film for reducing friction between the rear surface of the substrate and a holding surface configured to hold the rear surface of the substrate during an exposure process. A fluororesin film is exemplified as a specific example of a friction reducing film formed by the film forming part.

PRIOR ART DOCUMENT

Patent Document

Patent Document 1: Japanese Laid-Open Patent Publication No. 2019-121683

SUMMARY

According to embodiments of the present disclosure, there is provided a substrate processing apparatus including a hydrophobizing part configured to perform a hydrophobizing process of forming a hydrophobic film on a front surface of a substrate through vapor deposition of a hydrophobizing gas, an ultraviolet radiation part configured to radiate ultraviolet rays to a removal area on a rear surface of the substrate so as to remove the hydrophobic film formed in the removal area in the hydrophobizing process, and a resin-film forming part configured to form a fluororesin film in the removal area after the hydrophobic film is removed.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 6 is a flowchart illustrating an exemplary coating and development process.

FIG. 7 is a flowchart illustrating an exemplary processing film forming process.

DETAILED DESCRIPTION

Figure 1:
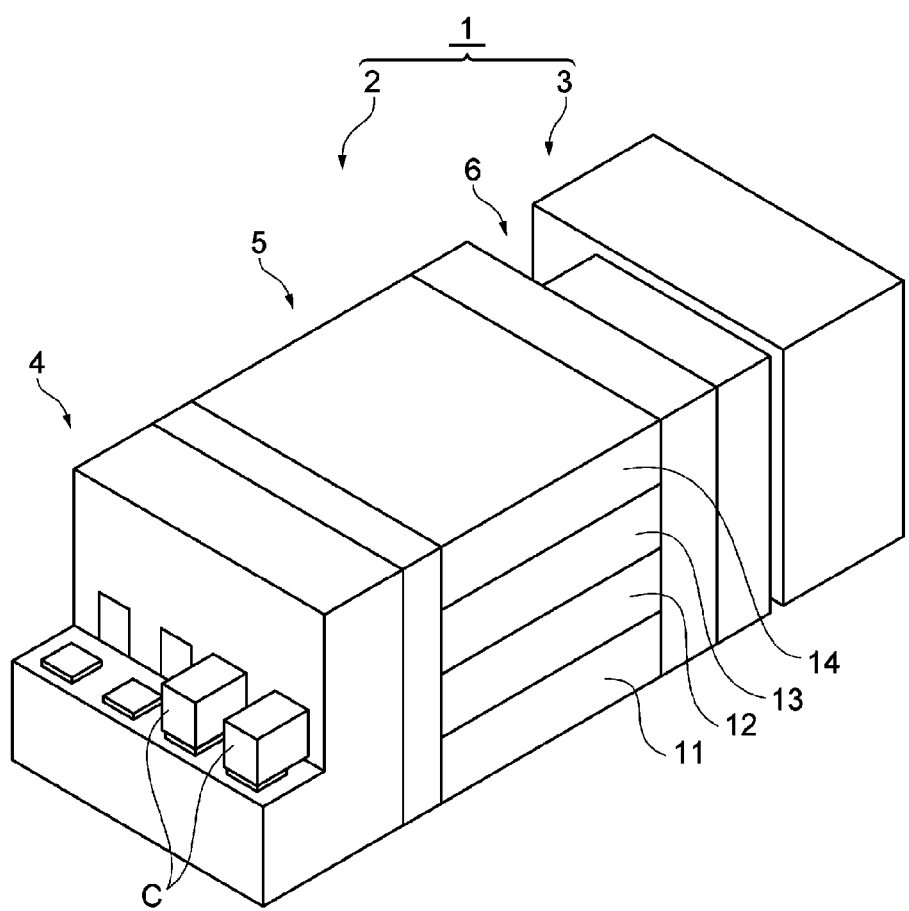
FIG. 1 is a schematic perspective view illustrating an exemplary substrate processing system.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, various exemplary embodiments will be described.

A substrate processing apparatus according to an exemplary embodiment includes: a hydrophobizing part configured to perform a hydrophobizing process of forming a hydrophobic film on a front surface of a substrate through vapor deposition of a hydrophobizing gas; an ultraviolet radiation part configured to radiate ultraviolet rays to a removal area on a rear surface of the substrate so as to remove the hydrophobic film formed in the removal area in the hydrophobizing process; and a resin-film forming part configured to form a fluororesin film in the removal area after the hydrophobic film is removed.

In this substrate processing apparatus, a fluororesin film is formed in an area where the hydrophobic film has not been formed and in an area where the hydrophobic film has been removed. On the other hand, the fluororesin film is not formed in an area where the hydrophobic film is formed. That is, the area where the hydrophobic film is removed by radiating ultraviolet rays corresponds to a fluororesin film formation range. Therefore, by adjusting the hydrophobic film removal area by radiating ultraviolet rays, it is possible to adjust the fluororesin film formation range in the substrate surface.

The substrate processing apparatus may further include a coating film forming part configured to form a coating film on the front surface of the substrate by supplying a processing liquid to the front surface of the substrate after forming the fluororesin film. In this case, it is possible to form the coating film on the front surface of the substrate in the state in which the fluororesin film formed on the rear surface is held.

The substrate processing apparatus may further include a development part configured to perform a development process on the substrate after the coating film thereon is exposed. The removal area may be set to an area other than a peripheral edge portion on the rear surface. In this case, since the fluororesin film is formed in the area other than the peripheral edge portion on the rear surface, it is possible to reduce friction between a substrate holder and the rear surface of the substrate in an exposure process.

The ultraviolet radiation part may include an ultraviolet illumination part capable of radiating ultraviolet rays to an area including the removal area, and a light-blocking member disposed between the ultraviolet illumination part and the rear surface so as to block ultraviolet rays radiated to the area other than the removal area on the rear surface. In this case, since it is possible to adjust the hydrophobic film removal area depending on the shape of the light-blocking member, it is easy to adjust the fluororesin film formation range.

The light-blocking member may include a holding arm configured to hold the substrate in the state of covering the area other than the removal area on the rear surface. In this case, since the transportation of the substrate and the blocking of ultraviolet rays can be performed by the holding arm, it is possible to simplify the apparatus.

The light-blocking member may include a cover member disposed between the holder that holds the substrate and the ultraviolet illumination part. In this case, since the fluororesin film formation range can be adjusted depending on the shape of the cover member, the holder can be simplified.

The hydrophobizing part may be configured to perform vapor deposition of the hydrophobizing gas on the front surface by supplying the hydrophobizing gas into the processing space for performing the hydrophobizing process. The resin-film forming part may be configured to perform vapor deposition of the processing gas on the rear surface by supplying a processing gas for forming the fluororesin film into the processing space. In this case, since a unit that forms the processing space can be shared between the hydrophobizing process and the formation of the fluororesin film, it is possible to simplify the apparatus.

A substrate processing method according to an exemplary embodiment includes performing a hydrophobizing process to form a hydrophobic film on a front surface of a substrate through vapor deposition of a hydrophobizing gas, removing the hydrophobic film formed in a removal area in the hydrophobizing process by radiating ultraviolet rays to the removal area on a rear surface of the substrate, and forming a fluororesin film in the removal area after the hydrophobic film is removed. In this substrate processing method, it is possible to adjust the fluororesin film formation range in the same manner as the above-mentioned substrate processing apparatus.

Hereinafter, an embodiment will be described with reference to the drawings. In the description, the same elements or elements having the same function will be denoted by the same reference numerals, and a redundant description thereof will be omitted.

[Substrate Processing System]

A substrate processing system 1 illustrated in FIG. 1 is a system for performing, on a workpiece W, formation of a photosensitive film, exposure of the photosensitive film, and development of the photosensitive film. The workpiece W to be processed is, for example, a substrate, or a substrate on which, for example, a film or a circuit is formed by being subjected to a predetermined process. A substrate included in the workpiece W is, for example, a wafer including silicon. The workpiece W (a substrate) may be formed in a circular shape.

The workpiece W to be processed may be, for example, a glass substrate, a mask substrate, or a flat panel display (FPD), or may be an intermediate obtained by performing a predetermined process on, for example, one of these substrates. When a bevel (a chamfer) is present on the edge of the workpiece W, the "front surface" of the workpiece W in the present specification also includes the beveled portion when viewed from the front surface side of the workpiece W. Similarly, the "rear surface" of the workpiece W also includes the beveled portion when viewed from the rear surface side of the workpiece W, and the "end surface" of the workpiece W also includes the beveled portion when viewed from the end surface side of the workpiece W. The photosensitive film is, for example, a resist film.

The substrate processing system 1 includes a coating and development apparatus 2 and an exposure apparatus 3. The exposure apparatus 3 is an apparatus for exposing a resist film (photosensitive film) formed on a workpiece W (a substrate). Specifically, the exposure apparatus 3 irradiates an exposure target portion of the resist film with an energy beam using a method such as, for example, liquid immersion exposure. The coating and development apparatus 2 performs a process of forming a resist film by applying a resist (a chemical liquid) to the front surface of the workpiece W before an exposure process by the exposure apparatus 3, and performs a resist film development process after the exposure process.

(Substrate Processing Apparatus)

Figure 2:
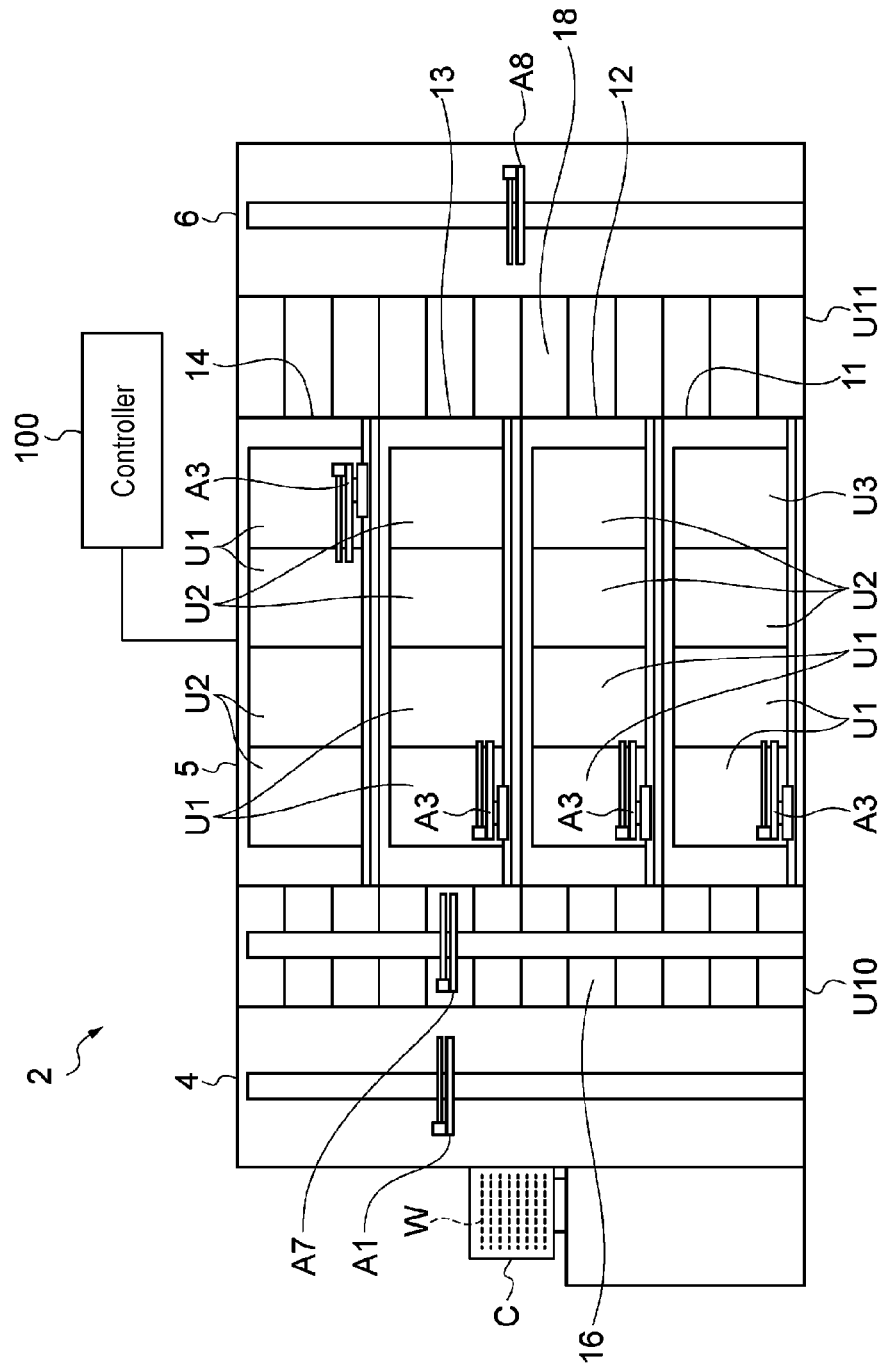
FIG. 2 is a schematic view illustrating an exemplary coating and development apparatus.

Hereinafter, the configuration of the coating and development apparatus 2 will be described as an example of a substrate processing apparatus. As illustrated in FIGS. 1 and 2, the coating and development apparatus 2 includes a carrier block 4, a processing block 5, an interface block 6, and a controller 100.

The carrier block 4 loads a workpiece W into the coating and development apparatus 2 and unloads a workpiece W from the inside of the coating and development apparatus 2. For example, the carrier block 4 is capable of supporting a plurality of carriers C for workpieces W, and incorporates a transport apparatus A1 including a delivery arm. Each carrier C accommodates, for example, a plurality of circular workpieces W. The transport apparatus A1 takes the workpieces W out of the carriers C so as to deliver the workpieces W to the processing block 5, and receives workpieces W from the processing block 5 so as to return the workpieces W into the carriers C. The processing block 5 includes processing modules 11, 12, 13, and 14.

The processing module 11 includes therein a liquid processing unit U1, a heat treatment unit U2, and a transport apparatus A3 configured to transport workpieces W to these units. The processing module 11 forms an underlayer film on the front surface of a workpiece W using the liquid processing unit U1 and the heat treatment unit U2. The liquid processing unit U1 applies a processing liquid for forming an underlayer film on the workpiece W. The heat treatment unit U2 performs various kinds of heat treatment associated with the formation of the underlayer film. The processing module 11 further includes a film forming unit U3. The film forming unit U3 performs a hydrophobizing process on the front surface of a workpiece W, on which an underlayer film is formed, and forms a film containing a fluororesin on the rear surface of the workpiece W. Details of the film forming unit U3 will be described later.

The processing module 12 includes therein a liquid processing unit U1, a heat treatment unit U2, and a transport apparatus A3 configured to transport workpieces W to these units. The processing module 12 forms a resist film on the underlayer film using the liquid processing unit U1 and the heat treatment unit U2. The liquid processing unit U1 (a coating film forming part) forms the resist film (a coating film) on the front surface of the workpiece W by supplying a processing liquid (resist) for forming the resist film to the front surface of the workpiece W after performing the hydrophobizing process on the workpiece W. The heat treatment unit U2 performs various kinds of heat treatment associated with the formation of the resist film.

The processing module 13 includes therein a liquid processing unit U1, a heat treatment unit U2, and a transport apparatus A3 configured to transport workpieces W to these units. The processing module 13 forms an upper-layer film on the resist film using the liquid processing unit U1 and the heat treatment unit U2. The liquid processing unit U1 applies a processing liquid for forming the upper-layer film on the resist film. The heat treatment unit U2 performs various kinds of heat treatment associated with the formation of the upper-layer film.

The processing module 14 includes therein a liquid processing unit U1, a heat treatment unit U2, and a transport apparatus A3 configured to transport workpieces W to these units. The processing module 14 performs a development process of the resist film subjected to an exposure process and heat treatment associated with the development process using the liquid processing unit U1 and the heat treatment unit U2. The liquid processing unit U1 (a development part) develops the resist film by applying a developer on the front surface of the workpiece W on which exposure has been completed and then rinsing the developer using a rinsing liquid. The heat treatment unit U2 performs various kinds of heat treatment associated with the development process. Specific examples of heat treatment include, for example, heat treatment before a development process (post-exposure bake (PEB)) and heat treatment after the development process (post bake (PB)).

A shelf unit U10 is provided on the carrier block 4 side in the processing block 5. The shelf unit U10 is partitioned into a plurality of cells aligned in the vertical direction. A transport apparatus A7 including a lifting arm is provided in the vicinity of the shelf unit U10. The transport apparatus A7 raises and lowers workpieces W between cells of the shelf unit U10.

A shelf unit U11 is provided on the interface block 6 side in the processing block 5. The shelf unit U11 is partitioned into a plurality of cells aligned in the vertical direction.

The interface block 6 delivers workpieces W to/from the exposure apparatus 3. For example, the interface block 6 incorporates a transport apparatus A8 including a delivery arm, and is connected to the exposure apparatus 3. The transport apparatus A8 delivers workpieces W placed on the shelf unit U11 to the exposure apparatus 3. The transport apparatus A8 receives the workpieces W from the exposure apparatus 3 and returns the workpieces W to the shelf unit U11.

(Film Forming Unit)

Figure 3:
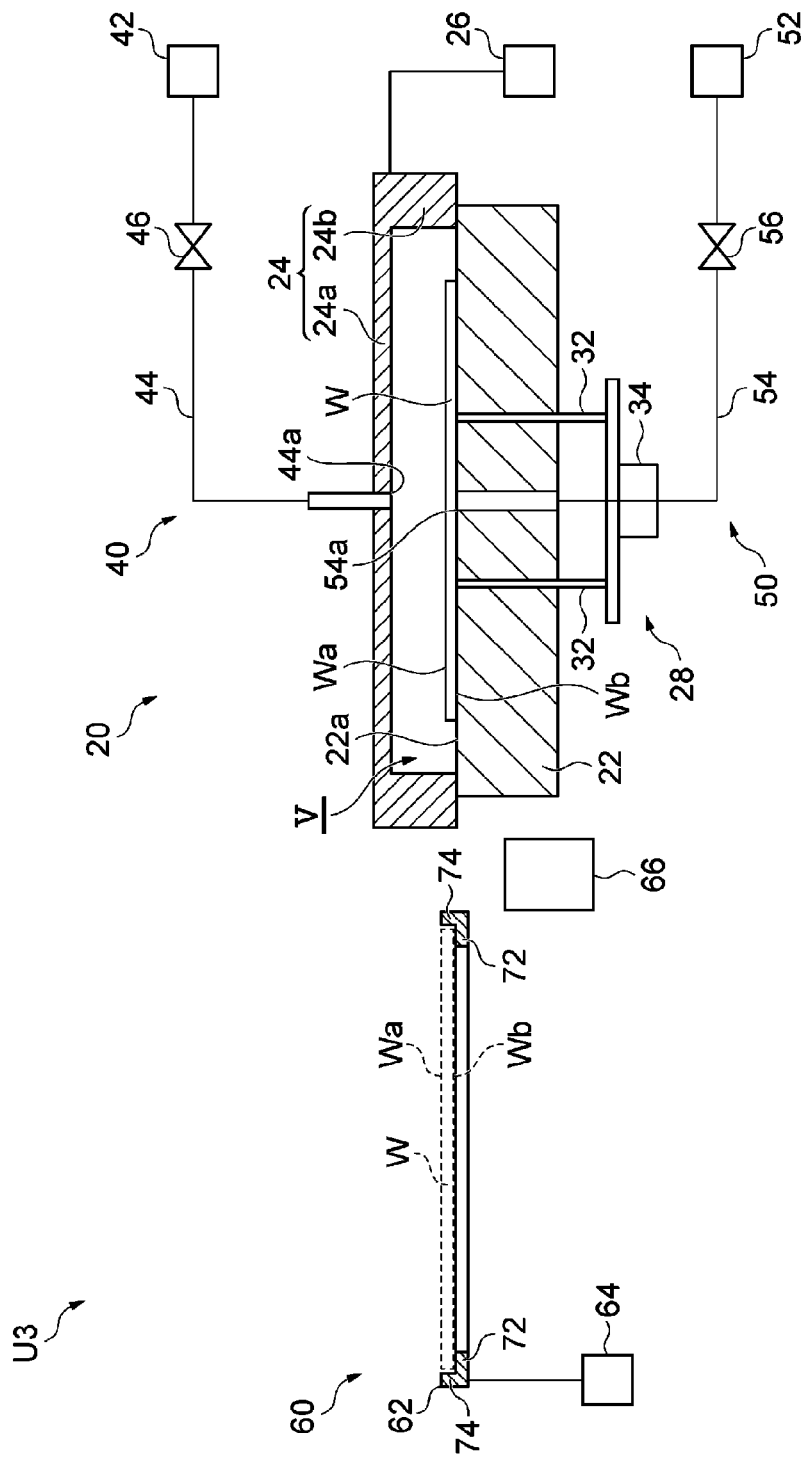
FIG. 3 is a schematic view illustrating an exemplary processing film forming unit.
Figure 4A:
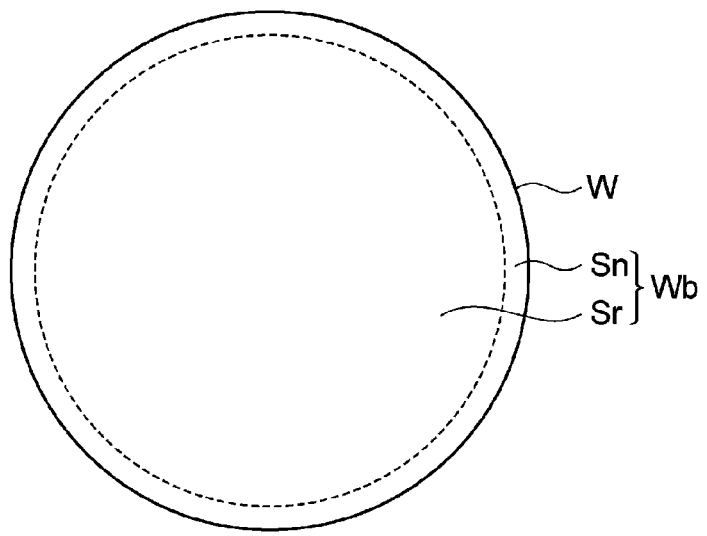
FIG. 4A is a schematic view illustrating an exemplary rear surface of a workpiece.
Figure 4B:
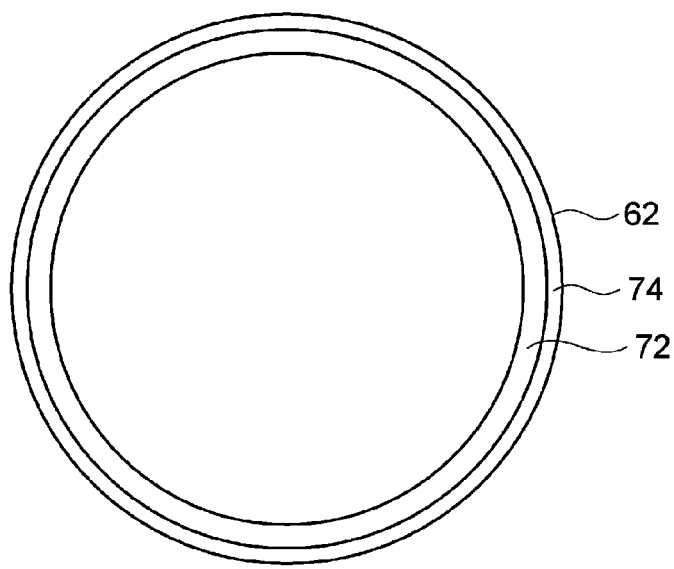
FIG. 4B is a plan view schematically illustrating an exemplary holding arm.

Subsequently, an exemplary film forming unit U3 will be described in detail with reference to FIGS. 3, 4A, and 4B. The film forming unit U3 sequentially performs a hydrophobizing process on the front surface Wa of a workpiece W, radiation of ultraviolet rays to the rear surface Wb of the workpiece W, and formation of a film containing a fluororesin (hereinafter, referred to as a "fluororesin film Ff") on the rear surface Wb of the workpiece W. As illustrated in FIG. 3, the film forming unit U3 has a vapor deposition part 20 and an ultraviolet radiation part 60. A portion of the vapor deposition part 20 and the ultraviolet radiation part 60 may be accommodated in one housing (not illustrated).

In the film forming unit U3 illustrated in FIG. 3, after the vapor deposition part 20 performs the hydrophobizing process on the front surface Wa of the workpiece W, the ultraviolet radiation unit 60 radiates ultraviolet rays to the workpiece W. Then, the vapor deposition part 20 forms a fluororesin film Ff on the rear surface Wb of the workpiece W after the radiation of the ultraviolet rays. By performing the hydrophobizing process, a hydrophobized film (hereinafter, referred to as a "hydrophobic film Fh") is formed on the front surface Wa of the workpiece W. Hereinafter, the hydrophobic film Fh and the fluororesin film Ff are collectively referred to as a "processing film", and a process including a hydrophobizing process and a fluororesin film forming process is referred to as a "processing film forming process". Hereinafter, each element of the vapor deposition part 20 and each element of the ultraviolet radiation part 60 will be described in the order in which processes are performed on a workpiece W. The vapor deposition part 20 includes, for example, a hot plate 22, a chamber 24, a lifting part 28, a hydrophobizing part 40, and a fluororesin film forming part 50.

The hot plate 22 is configured to heat a workpiece W. The hot plate 22 is formed in, for example, a substantially disk-like shape, and is provided horizontally on a support table (not illustrated). The hot plate 22 has a placement surface 22a. A workpiece W to be processed is placed on the placement surface 22a, whereby the hot plate 22 supports the workpiece W. The hot plate 22 heats the workpiece W placed on the placement surface 22a. The hot plate 22 may include a heater made of a resistance-heating element. The heater is provided, for example, inside the hot plate 22 or on the bottom surface opposite the placement surface 22a.

The chamber 24 is configured to surround the placement surface 22a of the hot plate 22. The chamber 24 has, for example, a ceiling plate 24a and a side wall 24b. The ceiling plate 24a is formed in a disk shape having a diameter similar to that of the hot plate 22. The ceiling plate 24a is disposed so as to face the placement surface 22a in the vertical direction. The side wall 24b is formed to extend downward from the outer edge of the ceiling plate 24a.

The chamber 24 is configured to be movable in the vertical direction. The chamber 24 moves, for example, between a lowered position for forming a space (hereinafter, referred to as a "processing space V") for forming a processing film and a raised position where the processing space V is opened. The lower end of the side wall 24b may be in contact with the hot plate 22 when the chamber 24 is located at the lowered position. The vapor deposition part 20 further includes a chamber driver 26 configured to raise and lower the chamber 24. The chamber driver 26 is a lifting actuator that raises and lowers the chamber 24 using a power source such as an air cylinder or an electric motor.

The lifting part 28 is configured to raise and lower the workpiece W above the hot plate 22. The lifting part 28 has, for example, a plurality of support pins 32 and a pin driver 34. The support pins 32 are pins that support the workpiece W from below. The plurality of support pins 32 are formed so as to extend in the vertical direction, and are provided in a state of penetrating the hot plate 22 in the vertical direction. The plurality of support pins 32 may be arranged at regular intervals in the circumferential direction.

The plurality of support pins 32 are configured to be movable in the vertical direction. The plurality of support pins 32 move, for example, between a placement position for placing the workpiece W on the placement surface 22a of the hot plate 22 and a separation position for separating the workpiece W upward from the placement surface 22a. The pin driver 34 moves the workpiece W in the vertical direction by raising and lowering the plurality of support pins 32. The pin driver 34 is a lifting actuator that raises and lowers the plurality of support pins 32 using a power source such as an air cylinder or an electric motor.

The hydrophobizing part 40 is configured to perform a hydrophobizing process of forming the hydrophobic film on the front surface Wa of the workpiece W by vapor deposition of a gas for the hydrophobizing process (hereinafter, referred to as a "hydrophobizing gas"). By performing the hydrophobizing process on the front surface Wa of the workpiece W (by forming the hydrophobic film Fh), adhesion between the resist film formed on the front surface Wa after the hydrophobizing process and the front surface Wa is ensured. The hydrophobizing gas is not limited, as long as it contains a compound capable of hydrophobizing the front surface Wa. For example, the hydrophobizing gas may be a gas containing hexamethyldisilazane (HMDS) (($CH_3$)$_3$SINHSi($CH_3$)$_3$). The hydrophobizing part 40 supplies the hydrophobizing gas to the processing space V in the state in which the chamber 24 is lowered so as to form the processing space V.

The hydrophobizing part 40 includes, for example, a gas supply source 42, a gas supply path 44, and an opening/closing valve 46. The gas supply source 42 is a hydrophobizing gas supply source. The gas supply source 42 may be a supply source of a gas containing HMDS (hereinafter, referred to as an "HMDS gas"). The gas supply source 42 may vaporize a raw material liquid containing HMDS to generate an HMDS gas, and may send the HMDS gas toward the processing space V using nitrogen gas. The gas supply path 44 connects the gas supply source 42 to the processing space V formed in the chamber 24. The end of the gas supply path 44 on the processing space V side penetrates, for example, the ceiling plate 24a of the chamber 24 in the vertical direction, and the supply port 44a formed at the end opens into the processing space V.

The opening/closing valve 46 is provided in the gas supply path 44, and opens/closes the flow path of the gas supply path 44. When the opening/closing valve 46 is in the open state, the hydrophobizing gas is supplied from the gas supply source 42 to the processing space V, and when the opening/closing valve 46 is in the closed state, the hydrophobizing gas is not supplied from the gas supply source 42 to the processing space V. The vapor deposition part 20 may further include an exhaust part so as to discharge the gas in the processing space V (e.g., a hydrophobizing gas). As an example, in an atmosphere in which the HMDS gas is present in the processing space V, the workpiece W is heated by the hot plate 22, and a silyl group is bonded to the front surface Wa. As a result, a hydrophobic film Fh (a silylated film) is formed on the front surface Wa of the workpiece W.

When a hydrophobizing process is performed by vapor deposition of the hydrophobizing gas such as an HMDS gas, the workpiece W is placed on the placement surface 22a. A fine gap may occur between the rear surface Wb of the workpiece W and the placement surface 22a. Therefore, the hydrophobizing gas reaches up to the rear surface Wb, and the hydrophobic film Fh is also formed on the peripheral edge portion of the rear surface Wb and the area inside the peripheral edge portion. The film forming unit U3 removes a part of the hydrophobic film Fh formed on the rear surface Wb by the ultraviolet radiation part 60.

The ultraviolet radiation part 60 is configured to remove the hydrophobic film Fh formed in the removal area Sr on the rear surface Wb in the hydrophobizing process by radiating ultraviolet rays to a predetermined area (hereinafter, referred to as a "removal area Sr") on the rear surface Wb of the workpiece W. The ultraviolet radiation part 60 is configured so as not to remove the hydrophobic film Fh formed in an area other than the removal area Sr (hereinafter, referred to as "non-removal area Sn") on the rear surface Wb. For example, the ultraviolet radiation part 60 is configured so as not to radiate ultraviolet rays to the non-removal area Sn. As illustrated in FIG. 4A, the non-removal area Sn may be set on the entire circumference of the peripheral edge portion of the rear surface Wb, and the removal area Sr may be set inside the non-removal area Sn. The non-removal area Sn may be set so as to cover the entire beveled portion of the rear surface Wb. For example, on the entire circumference of the workpiece W, the radial width of the non-removal area Sn may be larger than the width of the beveled portion.

As illustrated in FIG. 3, the ultraviolet radiation part 60 is arranged side by side with the vapor deposition part 20 (the hot plate 22 and the chamber 24) in the horizontal direction. The ultraviolet radiation part 60 includes, for example, a holding arm 62, an arm driver 64, and an ultraviolet lamp 66 (an ultraviolet illumination part). The holding arm 62 is configured to hold the workpiece W. The holding arm 62 holds, for example, the rear surface Wb of the workpiece W. The holding arm 62 is movably provided in a housing that houses the ultraviolet radiation part 60, the hot plate 22, the chamber 24, and the lifting part 28. For example, the holding arm 62 is configured to be movable along a guide rail (not illustrated) extending in the horizontal direction.

The holding arm 62 moves between a delivery position that overlaps the hot plate 22 and a standby position that is horizontally separated from the delivery position. In the state in which the chamber 24 is separated from the hot plate 22 and the processing space V opens, the workpiece W is delivered between the holding arm 62 and the support pin 32 at the delivery position. The arm driver 64 moves the workpiece W between the standby position and the delivery position by moving the holding arm 62 in the horizontal direction. The arm driver 64 is a horizontal actuator that reciprocates the holding arm 62 in the horizontal direction using a power source such as an electric motor. FIG. 3 illustrates the state in which the holding arm 62 is located at the standby position.

The holding arm 62 may hold the peripheral edge portion of the workpiece W. As illustrated in FIG. 4B, the holding arm 62 may have an annular shape (a ring shape) when viewed from the vertical direction. The holding arm 62 illustrated in FIG. 4B includes a support portion 72 extending in the horizontal direction and a restraining portion 74 extending upward (see also FIG. 3). The support portion 72 is formed in an annular shape and supports the entire circumference of the peripheral edge portion of the rear surface Wb. The restraining portion 74 is provided on, for example, the entire circumference or a part of the outer edge (side surface) of the annular support portion 72, and restrains the horizontal movement of the workpiece W.

In the state in which the holding arm 62 holds the workpiece W, the support portion 72 covers the peripheral edge portion of the rear surface Wb of the workpiece W. Specifically, the support portion 72 covers the non-removal area Sn in the real surface Wb when viewed in the direction from the rear surface Wb to the front surface Wa. That is, the width of the support portion 72 (the length in the radial direction) is substantially the same as the width of the non-removal area Sn (the length in the radial direction of the workpiece W). In other words, the shape of the support portion 72 seen in the thickness direction corresponds to the non-removal area Sn, and the shape (contour) of the opening formed in the central portion of the support portion 72 corresponds to the removal area Sr.

The ultraviolet lamp 66 is a light source capable of emitting ultraviolet rays for removing the hydrophobic film Fh. The ultraviolet lamp 66 may emit ultraviolet rays having any wavelength, as long as it is possible to remove the hydrophobic film Fh. As illustrated in FIG. 3, the ultraviolet lamp 66 may be disposed between the standby position of the holding arm 62 and the vapor deposition part 20 (the delivery position above the hot plate 22). The ultraviolet lamp 66 is located, for example, below the moving line in which the holding arm 62 moves in the horizontal direction, and emits ultraviolet rays upward.

The ultraviolet lamp 66 is capable of radiating ultraviolet rays to at least the removal area Sr on the rear surface Wb of the workpiece W. The ultraviolet lamp 66 may radiate ultraviolet rays to a line-shaped irradiation area extending along a horizontal line intersecting the moving line of the holding arm 62. The width (the length of the long axis) of the ultraviolet radiation range of the ultraviolet lamp 66 may be about the same as the diameter of the workpiece W, or may be greater than the diameter of the workpiece W. The ultraviolet lamp 66 emits ultraviolet rays toward the rear surface Wb of the workpiece W, which is passing above the ultraviolet lamp 66 while being moved by the arm driver 64. When the line-shaped ultraviolet radiation range is equal to or larger than the diameter of the workpiece W, it is possible for the ultraviolet lamp 66 to radiate ultraviolet rays to the entire area on the rear surface Wb of the workpiece W.

As described above, since the holding arm 62 holds the workpiece W in the state in which the support portion 72 of the holding arm 62 covers the non-removal area Sn on the rear surface Wb, some of the ultraviolet rays emitted toward the entire area of the rear surface Wb are blocked by the holding arm 62 without reaching the non-removal area Sn. The bottom surface of the holding arm 62 (the support portion 72) may be made of a material that reflects or absorbs ultraviolet rays emitted from the ultraviolet lamp 66. As described above, the holding arm 62 illustrated in FIGS. 3 and 4B is disposed between the ultraviolet lamp 66 and the rear surface Wb, and functions as a light-blocking member that blocks ultraviolet rays radiated to the non-removal area Sn on the rear surface Wb. The size of the non-removal area Sn (the removal area Sr) set on the rear surface Wb is defined by the support portion 72 of the holding arm 62. That is, since the ultraviolet rays do not reach the area of the rear surface Wb covered by the support portion 72 and the hydrophobic film Fh is not removed, the area becomes the non-removal area Sn.

Returning back to the description of the vapor deposition part 20, the fluororesin film forming part 50 is configured to form a fluororesin film Ff in the removal area Sr after the hydrophobic film Fh is removed. The fluororesin film forming part 50 may be configured to deposit a processing gas on the rear surface Wb by supplying a gas for forming a fluororesin film (hereinafter, referred to as a "processing gas") to the processing space V. The processing gas is not limited, as long as it is possible to form a fluororesin film Ff, and is, for example, a gas containing polytetrafluoroethylene (PTFE) as a compound.

The fluororesin film forming part 50 includes, for example, a gas supply source 52, a gas supply path 54, and an opening/closing valve 56. The gas supply source 52 is a supply source of a processing gas for forming the fluororesin film. The gas supply path 54 may be the source of a gas containing PTFE (hereinafter, referred to as a "PTFE gas"). The gas supply path 54 may vaporize a raw material liquid containing PTFE to generate a PTFE gas, and may send the PTFE gas toward the processing space V using nitrogen gas. The gas supply path 54 connects the gas supply source 52 to the processing space V formed in the chamber 24. The end of the gas supply path 54 on the processing space V side penetrates, for example, the hot plate 22 in the vertical direction, and the supply port 54a formed at the end opens into the processing space V.

The opening/closing valve 56 is provided in the gas supply path 54, and opens/closes the flow path of the gas supply path 54. When the opening/closing valve 56 is in the open state, the processing gas is supplied from the gas supply source 52 to the processing space V, and when the opening/closing valve 56 is in the closed state, the processing gas is not supplied from the gas supply source 52 to the processing space V. As an example, in the state in which the workpiece W is disposed at a spaced position where the rear surface Wb and the hot plate 22 are spaced apart from each other by the plurality of support pins 32, PTFE gas is supplied into the processing space V, and thus the PTFE gas is deposited on the rear surface Wb (a fluororesin film Ff is formed). At this time, while the PTFE gas is deposited in the area on the rear surface Wb where the hydrophobic film Fh is not formed (the removal area Sr), the PTFE gas is not deposited in the area where the hydrophobic film Fh is formed (non-removal area Sn). As a result, the fluororesin film Ff is not formed in the non-removal area Sn, but the fluororesin film Ff is formed in the removal area Sr.

The fluororesin film Ff formed on the rear surface Wb (the removal area Sr) has a function of reducing the friction between a member holding the rear surface Wb and the rear surface Wb in a step after the process performed by the film forming part U3, or a function of protecting the rear surface Wb. For example, in the exposure apparatus 3 in which the exposure process is performed after the resist film is formed in the coating and development apparatus 2, the workpiece W is placed from the lifting pins supporting the central portion of the workpiece W to the stage in order to perform the exposure process on the resist film. Then, the workpiece W is held in the state of being attracted to the stage, and a shot (radiation of energy rays) is performed in the state in which the position of the workpiece W is fixed on the stage.

However, since the outer peripheral portion of the workpiece W supported by the lifting pins is bent downward with respect to the central portion due to the weight of the workpiece W, the workpiece W comes into contact with the stage surface in sequence from the outer peripheral portion to the central portion of the workpiece W. As a result, since the outer peripheral portion of the workpiece W is first attracted to the stage, the central portion of the workpiece W may be attracted in a stressed state. Further, even when the workpiece W transported to the exposure apparatus 3 is not flat but is distorted, the workpiece W can be held on the stage in the state of being stressed. When the workpiece W is attracted to the stage while the workpiece W is stressed in this way, the workpiece W may be deformed and the shot may be performed in an area deviated from a desired area.

On the other hand, since the fluororesin film Ff is formed on the rear surface Wb of the workpiece W, the friction between the rear surface Wb and the stage of the exposure apparatus 3 is reduced by the fluororesin film Ff. That is, the fluororesin film Ff serves to reduce the friction between a holder that holds the rear surface Wb of the substrate and the rear surface Wb as a friction reducing film. As a result, when the workpiece W is placed on the stage of the exposure apparatus 3, the workpiece W is placed so as to slide on the stage due to the reduction of friction, and the above-mentioned stress is reduced. As a result, it is possible to suppress the deviation between a target position on the stage of the exposure apparatus 3 and the placement position of the workpiece W.

(Controller)

Figure 5:
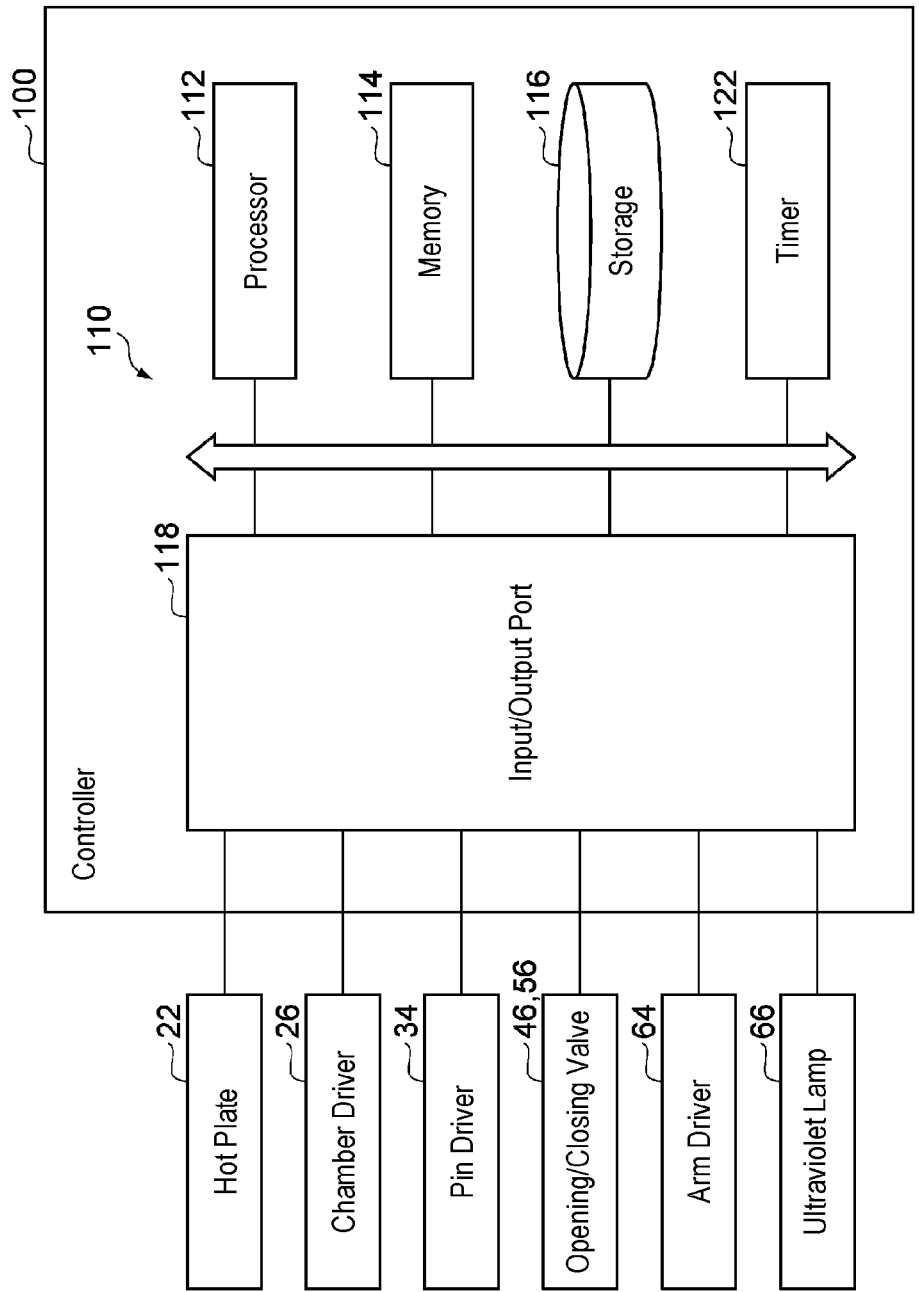
FIG. 5 is a block diagram illustrating an exemplary hardware configuration of a controller.

Next, the controller 100 will be described with reference to FIG. 5. The controller 100 controls each element of the coating and development apparatus 2. The controller 100 is configured to cause the hydrophobizing part 40 to deposit the hydrophobizing gas for the hydrophobizing process on the front surface Wa of the workpiece W so as to form the hydrophobic film Fh on the front surface Wa of the workpiece W. In addition, the controller 100 is configured to cause the ultraviolet radiation part 60 to radiate ultraviolet rays to the removal area Sr so as to remove the hydrophobic film Fh formed in the removal area Sr in the hydrophobizing process, and to cause the fluororesin film forming part 50 to form the fluororesin film Ff in the removal area Sr after the hydrophobic film Fh is removed.

The controller 100 is configured with one or more control computers. For example, the controller 100 includes a circuit 110 illustrated in FIG. 5. The circuit 110 includes one or more processors 112, a memory 114, a storage 116, an input/output port 118, and a timer 122. The storage 116 has a non-transitory computer-readable storage medium such as a hard disc. The storage medium stores a program for causing the controller 100 to execute a substrate processing method to be described later. The storage medium may be a removable medium, such as nonvolatile semiconductor memory, a magnetic disc, or an optical disc. The memory 114 temporarily stores a program loaded from the storage medium of the storage 116 and the result of an arithmetic operation performed by the processor 112.

The processor 112 executes the above program in cooperation with the memory 114. The input/output port 118 inputs/outputs electrical signals between, for example, the hot plate 22 (a heater), the chamber driver 26, the pin driver 34, the opening/closing valves 46 and 56, the arm driver 64, and the ultraviolet lamp 66 in response to a command from the processor 112. A timer 122 counts the elapsed time by counting, for example, reference pulses at a predetermined period. For example, the hardware configuration of the controller 100 may be constituted by a dedicated logic circuit or an application-specific integrated circuit (ASIC) in which the dedicated logic circuit is integrated.

[Coating and Development Process]

Next, a coating and development process performed in the coating and development apparatus 2 will be described with reference to FIG. 6 as an example of the substrate processing method. The controller 100 controls the coating and development apparatus 2 to execute a coating/developing process, for example, in the following procedure. First, the controller 100 controls the transport apparatus A1 to transport a workpiece W in a carrier C to the shelf unit U10, and controls the transport apparatus A7 to dispose the workpiece W in a cell for the processing module 11.

Next, the controller 100 controls the transport apparatus A3 to transport the workpiece W of the shelf unit U10 to the liquid processing unit U1 and the heat treatment unit U2 in the processing module 11. Further, the controller 100 controls the liquid processing unit U1 and the heat treatment unit U2 to form the underlayer film on the front surface Wa of the workpiece W (step S01). Thereafter, the controller 100 controls the transport apparatus A3 to transport the workpiece W to the film forming unit U3 after the underlayer film is formed on the workpiece W.

Next, the controller 100 executes the processing film forming process including performing the hydrophobizing process on the front surface Wa of the workpiece W and forming the fluororesin film on the rear surface Wb of the workpiece W (step S02). Details of step S02 will be described later. Thereafter, the controller 100 controls the transport apparatus A3 to return the workpiece W, after forming the underlayer film on the workpiece W, to the shelf unit U10, and controls the transport apparatus A7 to dispose the workpiece W in a cell for the processing module 12.

Next, the controller 100 controls the transport apparatus A3 to transport the workpiece W of the shelf unit U10 to the liquid processing unit U1 and the heat treatment unit U2 in the processing module 12. In addition, the controller 100 controls the liquid processing unit U1 and the heat treatment unit U2 to form the resist film on the front surface Wa of the workpiece W (step S03). Thereafter, the controller 100 controls the transport apparatus A3 to return the workpiece W to the shelf unit U10, and controls the transport apparatus A7 to dispose the workpiece W in a cell for the processing module 13.

Next, the controller 100 controls the transport apparatus A3 to transport the workpiece W in the shelf unit U10 to each unit in the processing module 13. In addition, the controller 100 controls the liquid processing unit U1 and the heat treatment unit U2 to form the upper-layer film on the resist film of the workpiece W (step S04). Thereafter, the controller 100 controls the transport apparatus A3 to transport the workpiece W to the shelf unit U11.

Next, the controller 100 controls the transport apparatus A8 so as to send the workpiece W in the shelf unit U11 to the exposure apparatus 3. Thereafter, the controller 100 controls the transport apparatus A8 to receive the exposed workpiece W from the exposure apparatus 3 and to dispose the workpiece W in a cell for the processing module 14 in the shelf unit U11.

Next, the controller 100 controls the transport apparatus A3 to transport the workpiece W of the shelf unit U11 to each unit in the processing module 14, and controls the liquid processing unit U1 and the heat treatment unit U2 to perform the development process on the resist film of the workpiece W (step S05). Thereafter, the controller 100 controls the transport apparatus A3 to return the workpiece W to the shelf unit U10 and controls the transport apparatus A7 and the transport apparatus A1 to return the workpiece W to the inside of the carrier C. Consequently, the coating and development process is completed.

(Processing Film Forming Process)

Subsequently, a processing film forming process in step S02 will be described with reference to FIGS. 7 to 10C. FIG.

7 is a flowchart illustrating an exemplary processing film forming process. In the processing film forming process, the controller 100 may control the hot plate 22 such that the temperature of the hot plate 22 is maintained at a predetermined value.

Figure 8A:
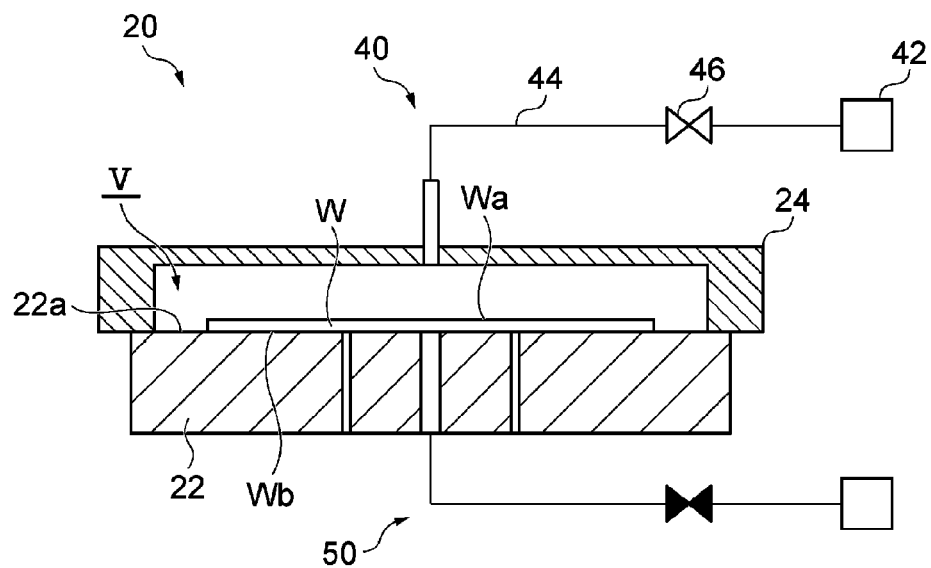
FIG. 8A is a schematic view illustrating a state of a hydrophobizing process.

First, the controller 100 controls the film forming unit U3 to form the hydrophobic film Fh on the front surface Wa of the workpiece W in the state in which the processing space V is formed by the chamber 24 and the workpiece W to be processed is placed on the hot plate 22 (step S11). In step S11, for example, as illustrated in FIG. 8A, the controller 100 switches the opening/closing valve 46 of the hydrophobizing part 40 from the closed state to the open state so as to supply the hydrophobizing gas to the processing space V from the gas supply source 42. Then, the controller 100 waits until a preset predetermined time elapses. After the lapse of the predetermined time, the controller 100 switches the opening/closing valve 46 from the open state to the closed state. As a result, in the processing space V, the front surface Wa of the workpiece W is exposed to the hydrophobizing gas, and the workpiece W is heated by the hot plate 22. As a result, the hydrophobizing process is performed on the workpiece W to be processed such that the hydrophobic film Fh is formed on at least the front surface Wa through vapor deposition.

Figure 8B:
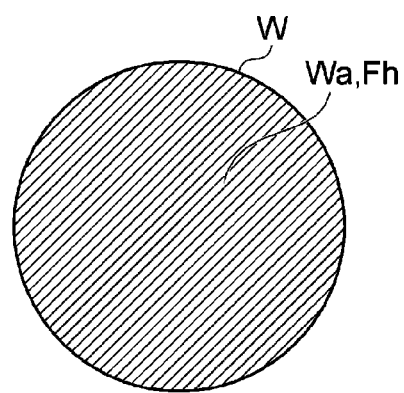
FIG. 8B is a schematic view illustrating an exemplary front surface of a workpiece after forming a hydrophobic film.
Figure 8C:
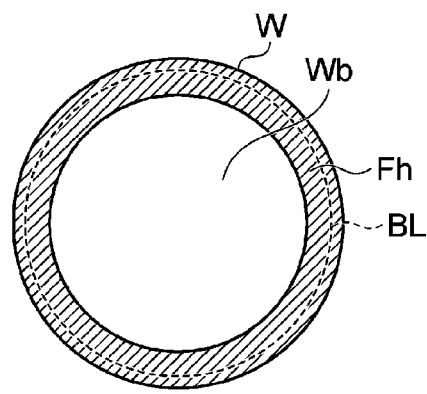
FIG. 8C is a schematic view illustrating an exemplary rear surface of a workpiece after forming a hydrophobic film.

By executing step S11, as illustrated in FIG. 8B, a hydrophobic film Fh is formed over the entire front surface Wa of the workpiece W. In addition, when the hydrophobizing process is performed, the hydrophobizing gas also reaches the rear surface Wb. Thus, as illustrated in FIG. 8C, a hydrophobic film Fh is also formed in the peripheral edge portion of the rear surface Wb (more specifically, the entire area of the non-removal area Sn and the peripheral edge portion of the removal area Sr). In FIG. 8C, a boundary between the non-removal area Sn and the removal area Sr is indicated by a boundary line BL (broken line). In FIG. 8C, the width of the hydrophobic film Fh in the radial direction of the workpiece W is constant, but the hydrophobic film Fh may be formed such that the width of the hydrophobic film Fh differs depending on the position in the circumferential direction of the workpiece W.

Next, the controller 100 controls various drivers so as to carry the workpiece W out of the inside of the processing space V to the standby position located outside the processing space V (step S12). For example, the controller 100 raises the chamber 24 using the chamber driver 26 to open the processing space V. Then, the controller 100 causes the arm driver 64 to move the holding arm 62 to the delivery position above the hot plate 22, and controls various drivers such that the workpiece W is delivered from the plurality of support pins 32 to the holding arm 62. Thereafter, the controller 100 causes the arm driver 64 to move the holding arm 62 in the horizontal direction to the standby position separated from the hot plate 22. As a result, the workpiece W is carried out of the processing space V. The controller 100 may perform a process of controlling the temperature of the workpiece W (a cooling process) by maintaining the state in which the holding arm 62 holds the workpiece W at the standby position. The controller 100 may cause the exhaust part to discharge the hydrophobizing gas in the processing space V before opening the processing space V.

Figure 9A:
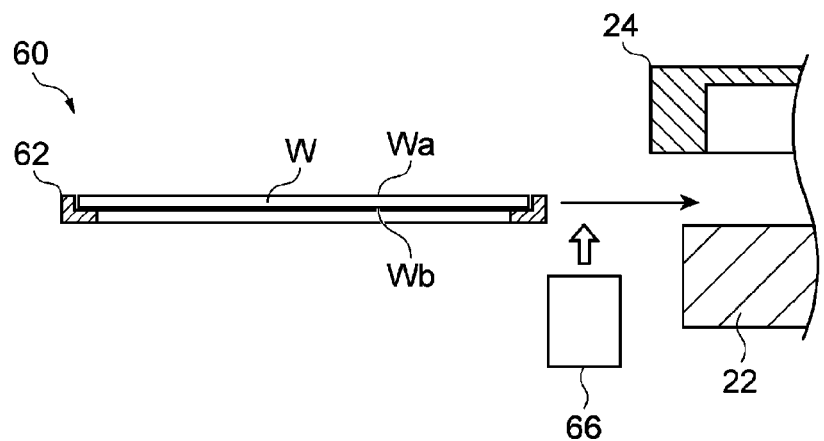
FIG. 9A is a schematic view illustrating a state of radiation of ultraviolet rays.
Figure 9B:
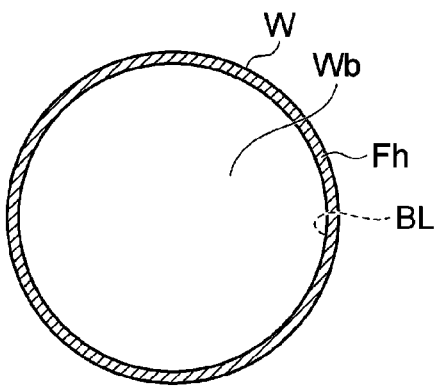
FIG. 9B is a schematic view illustrating an exemplary rear surface of a workpiece after radiation of ultraviolet rays.
Figure 9C:
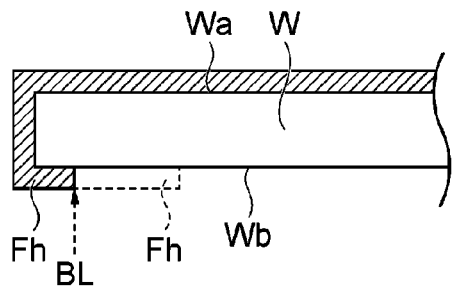
FIG. 9C is a side view schematically illustrating an exemplary workpiece after radiation of ultraviolet rays.

Next, the controller 100 controls the film forming unit U3 to radiate ultraviolet rays to the rear surface Wb while carrying the workpiece W into the processing space V from the standby position (step S13). For example, as illustrated in FIG. 9A, the controller 100 causes the ultraviolet lamp 66 to start emitting ultraviolet rays, and causes the arm driver 64 to move the holding arm 62 from the standby position to the delivery position above the hot plate 22. Then, after the holding arm 62 is moved to the delivery position (after the entire workpiece W passes the ultraviolet radiation range above the ultraviolet lamp 66), the controller 100 causes the ultraviolet lamp 66 to stop emitting ultraviolet rays. As described above, since the holding arm 62 holds the workpiece W in the state of covering the non-removal area Sn of the rear surface Wb, ultraviolet rays are radiated to the removal area Sr, and the hydrophobic film Fh formed in the removal area Sr is removed, as illustrated in FIGS. 9B and 9C.

After the holding arm 62 is moved to the delivery position, the controller 100 controls various drivers such that the workpiece W is delivered from the holding arm 62 to the plurality of support pins 32. Then, the controller 100 causes the chamber driver 26 to lower the chamber 24. As a result, the workpiece W, after being irradiated with ultraviolet rays, is carried back into the processing space V.

Figure 10A:
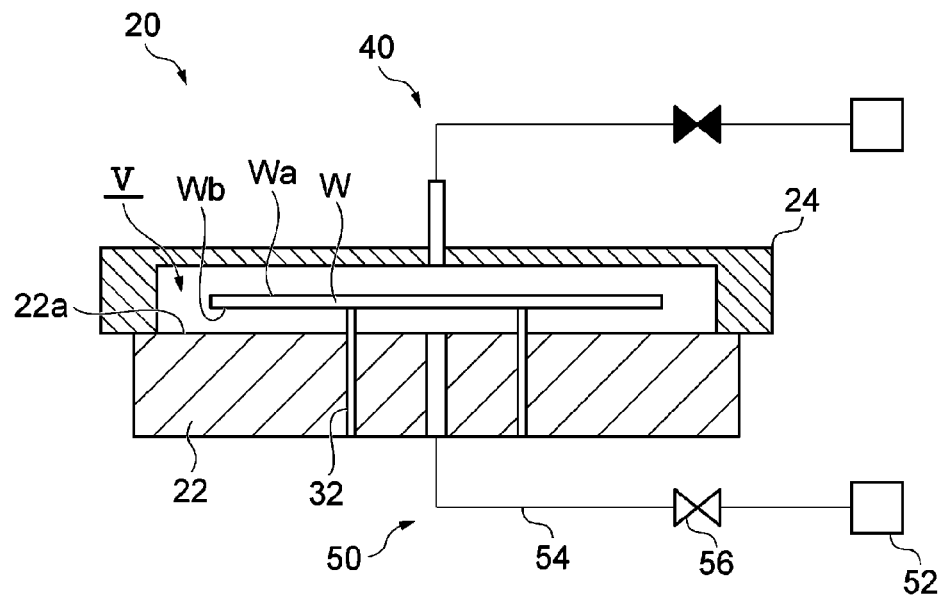
FIG. 10A is a schematic view illustrating a state of formation of a fluororesin film.

Next, the controller 100 controls the film forming unit U3 to form the fluororesin film Ff on the rear surface Wb of the workpiece W (step S14). For example, as illustrated in FIG. 10A, the controller 100 causes the pin driver 34 to maintain the state in which the plurality of support pins 32 support the workpiece W at a position separated from the hot plate 22. Then, the controller 100 switches the opening/closing valve 56 of the fluororesin film forming part 50 from the closed state to the open state, whereby the processing space V is supplied with a processing gas for forming the fluororesin film from the gas supply source 52.

Figure 10B:
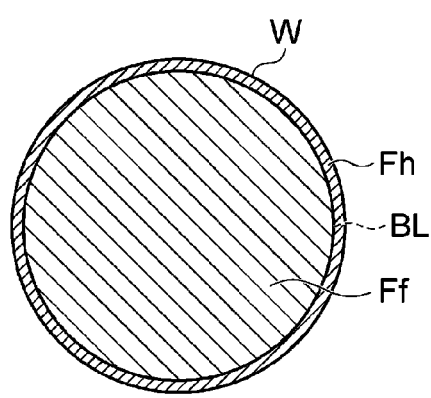
FIG. 10B is a schematic view illustrating an exemplary rear surface of a workpiece after formation of a fluororesin film.
Figure 10C:
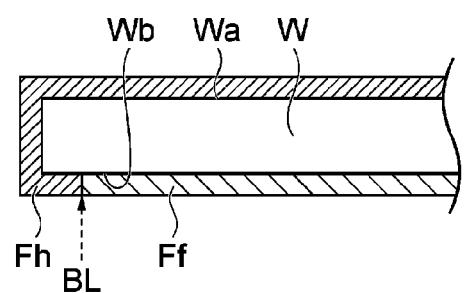
FIG. 10C is a side view schematically illustrating an exemplary workpiece after formation of a fluororesin film.

Thereafter, the controller 100 waits until a preset predetermined time elapses. After the lapse of the predetermined time, the controller 100 switches the opening/closing valve 56 from the open state to the closed state. Therefore, the rear surface Wb of the workpiece W is exposed to the processing gas in the processing space V. As a result, as illustrated in FIGS. 10B and 10C, the fluororesin film Ff is formed through vapor deposition in the removal area Sr. The film forming unit U3 (the vapor deposition part 20) may further have another support part in order to form a fluororesin film Ff at the positions where the plurality of support pins 32 support the workpiece W. This completes the processing film forming process.

Effect of Embodiment

The coating and development apparatus 2 illustrated above includes the hydrophobizing part 40 configured to perform the hydrophobizing process of forming the hydrophobic film Fh on the front surface Wa of the workpiece W through vapor deposition of the hydrophobizing gas, an ultraviolet radiation part 60 configured to remove the hydrophobic film Fh formed in the removal area Sr in the hydrophobizing process by radiating ultraviolet rays to the removal area Sr on the rear surface Wb of the workpiece W, and the fluororesin film forming part 50 configured to form the fluororesin film Ff in the removal area Sr after the hydrophobic film Fh is removed.

The coating/developing process illustrated above includes performing the hydrophobizing process of forming the hydrophobic film Fh on the front surface Wa of the workpiece W through vapor deposition of the hydrophobizing gas, removing the hydrophobic film Fh formed in the removal area Sr in the hydrophobizing process by radiating ultraviolet rays to the removal area Sr on the rear surface Wb of the workpiece W, and forming the fluororesin film Ff in the removal area Sr after the hydrophobic film Fh is removed.

In the above-described coating and development apparatus 2 and coating and development process, the fluororesin film Ff is formed in an area where the hydrophobic film Fh is not formed and an area where the hydrophobic film Fh is removed. On the other hand, in the area where the hydrophobic film Fh is formed (the area where the hydrophobic film Fh remains without being removed), the fluororesin film Ff is not formed. That is, the area where the hydrophobic film Fh is removed by irradiation with ultraviolet rays (the area where the hydrophobic film Fh remains) corresponds to the formation range of the fluororesin film Ff. Therefore, by adjusting the removal area Sr of the hydrophobic film Fh through the radiation of ultraviolet rays, it is possible to adjust the hydrophobic film Fh formation range on the rear surface Wb.

The coating and development apparatus 2 illustrated above further includes the liquid processing unit U1 configured to form the resist film on the front surface Wa of the workpiece W by supplying the processing liquid to the front surface Wa of the workpiece W after the fluororesin film Ff is formed. In this case, it is possible to form the resist film on the front surface Wa of the workpiece W in the state in which the fluororesin film Ff formed on the rear surface Wb is maintained.

The coating and development apparatus 2 illustrated above further includes the liquid processing unit U1 configured to perform the development process on the workpiece W after the resist film is exposed. The removal area Sr may be set in an area other than the peripheral edge portion on the rear surface Wb. In this case, since the fluororesin film Ff is formed in an area other than the peripheral edge portion of the rear surface Wb (the non-removal area Sn), friction between the holder (e.g., the stage) of the workpiece W and the rear surface Wb in the exposure process is reduced. This makes it possible to suppress the deviation of the exposure position with respect to the target position in the exposure process.

As described above, the fluororesin film Ff makes it possible to reduce friction in the exposure process. However, when the fluororesin film is formed on the beveled portion of the rear surface Wb, the processing result of the exposure process may be adversely affected. Therefore, conventionally, at least the following five steps are sequentially performed before forming the resist film. First, the hydrophobizing process is performed on the front surface Wa of the workpiece W using, for example, an HMDS gas, after an underlayer film is formed, and ultraviolet radiation (a removing process) is performed on the entire rear surface Wb in order to remove the hydrophobic film Fh formed on the rear surface Wb in the hydrophobizing process. Then, a masking process (a protective-film forming process) is performed on the beveled portion such that a fluororesin film made of, for example, PTFE is not formed on the beveled portion, and a fluororesin film forming process is performed. Thereafter, a process of removing the protective film formed on the beveled portion is performed using, for example, thinner.

In contrast, in the above-mentioned coating and development apparatus 2, it is possible to form the fluororesin film Ff on the rear surface Wb such that the fluororesin film is not formed on the beveled portion by sequentially performing the hydrophobizing process, radiation of ultraviolet rays (a removing process) and the fluororesin film forming process before forming the resist film. That is, it is possible to shorten the process compared with a conventional process.

In the above-described example, the ultraviolet radiation part 60 includes an ultraviolet lamp 66 capable of radiating ultraviolet rays to an area including the removal area Sr (e.g., the entire area of the rear surface Wb), and the light-blocking member disposed between the ultraviolet lamp 66 and the rear surface Wb and configured to block the radiation of the ultraviolet rays to the non-removal area Sn other than the removal area Sr on the rear surface Wb. In this case, since it is possible to adjust the removal area Sr of the hydrophobic film Fh depending on the shape of the light-blocking member, it is easy to adjust the fluororesin film Ff formation range.

In the above-described example, the light-blocking member of the ultraviolet radiation part 60 includes the holding arm 62 that holds the workpiece W in the state of covering the non-removal area Sn other than the removal area Sr on the rear surface Wb. In this case, since the holding arm 62 is capable of transporting the workpiece W and blocking ultraviolet rays, it is possible to simplify the coating and development apparatus 2 (film forming unit U3).

In the above-described example, the hydrophobizing part 40 is configured to perform vapor deposition of the hydrophobizing gas on the front surface Wa by supplying the hydrophobizing gas into the processing space V for performing the hydrophobizing process. The fluororesin film forming part 50 is configured to perform vapor deposition of the processing gas on the rear surface Wb by supplying the processing gas for forming the fluororesin film into the processing space V. In this case, since the unit that provides the processing space V can be commonly used in the hydrophobizing process and the fluororesin film formation, it is possible to simplify the coating and development apparatus 2 (the film forming unit U3). As illustrated in FIG. 3, since the ultraviolet radiation part 60 radiates ultraviolet rays from beneath, and the fluororesin film forming part 50 supplies the processing gas from below the processing space V, it is possible to perform the processing film forming process without reversing the workpiece W. That is, in the configuration of the film forming unit U3 illustrated in FIG. 3, it is possible to further shorten the process compared with a conventional process.

Modification

Figure 11A:
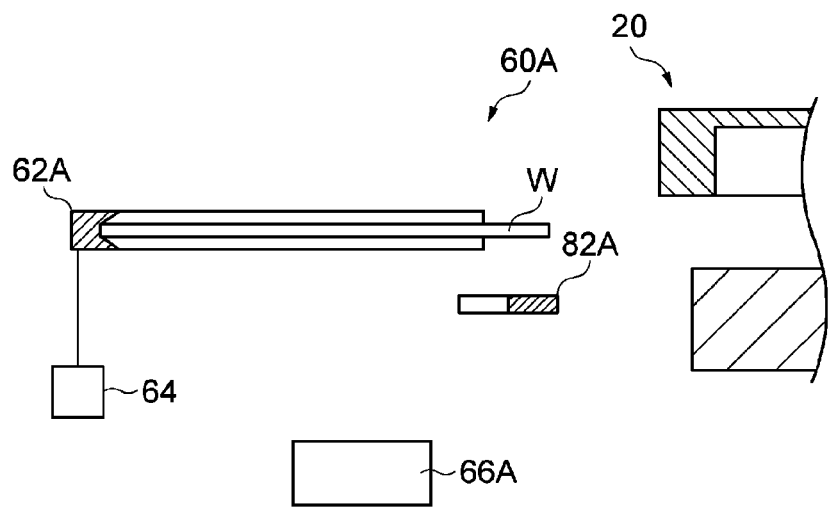
FIG. 11A is a side view schematically illustrating another exemplary ultraviolet radiation part.
Figure 11B:
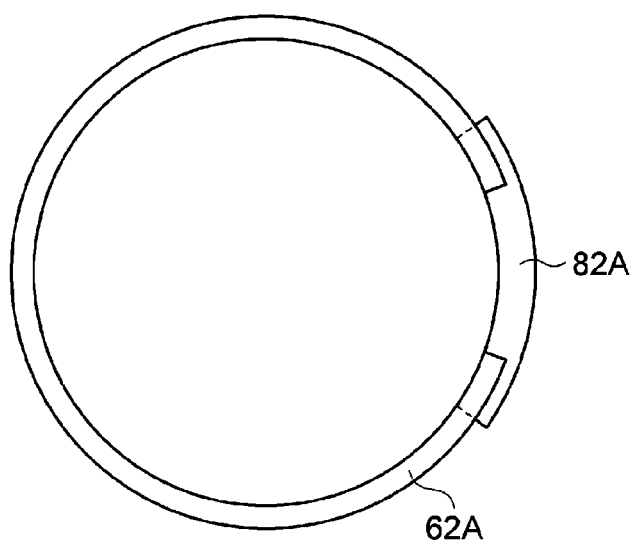
FIG. 11B is a plan view schematically illustrating another exemplary holding arm.

Although the embodiments according to the present disclosure have been described in detail above, various modifications may be added to the above-described embodiments within the scope of the gist of the present disclosure. As illustrated in FIG. 11A, the film forming unit U3 may have an ultraviolet radiation part 60A instead of the ultraviolet radiation part 60. The ultraviolet radiation part 60A differs from the ultraviolet radiation part 60 in that the former has a holding arm 62A instead of the holding arm 62, has an ultraviolet lamp 66A instead of the ultraviolet lamp 66, and further has a cover member 82A. The holding arm 62A differs from the holding arm 62 in that the holding arm 62A holds the workpiece W so as to sandwich the peripheral edge portion (e.g., the beveled portion) of the workpiece W. In the holding arm 62A, a portion located below the rear surface Wb covers the non-removal area Sn in the state in which the peripheral edge portion of the workpiece W is sandwiched. The holding arm 62A is formed in an annular shape in which a portion of the entire circumference (e.g., about ¼ to ⅙) is removed, rather than having the entire circumference corresponding to the peripheral edge of the workpiece W, as illustrated in FIG. 11B.

The cover member 82A is formed to cover the portion of the entire circumference at which the holding arm 62A is not provided. The cover member 82A may be a plate member formed in a shape (arc shape) along a portion of the peripheral edge of the workpiece W. The cover member 82A may be fixed at a predetermined position. In the ultraviolet radiation part 60A, when the holding arm 62A is located at the standby position, the non-removal area Sn is covered by the holding arm 62A and the cover member 82A. That is, the holding arm 62A and the cover member 82A form a light-blocking member that blocks ultraviolet rays directed to the non-removal area Sn. The ultraviolet lamp 66A may be configured to be capable of radiating ultraviolet rays to the entire rear surface Wb in the state in which the workpiece W is located at the standby position. In this case, the controller 100 may control the film forming unit U3 so as to separately execute the radiation of ultraviolet rays and the carrying of the workpiece W into the processing space V.

Figure 12A:
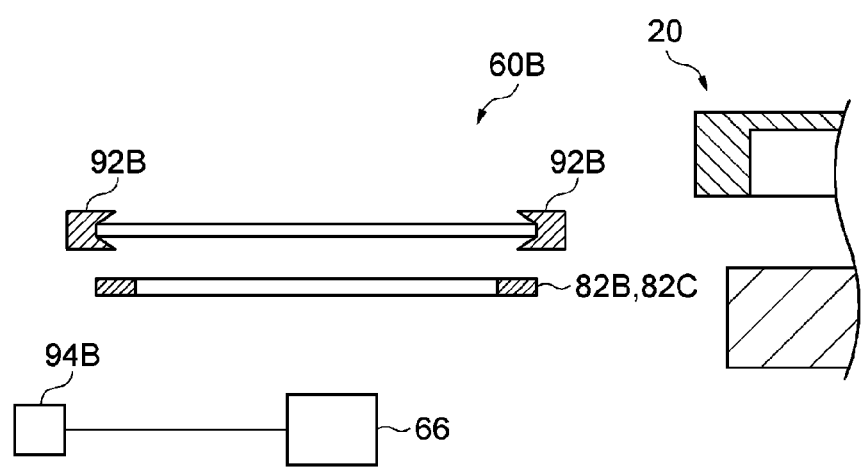
FIG. 12A is a side view schematically illustrating another exemplary ultraviolet radiation part.
Figure 12B:
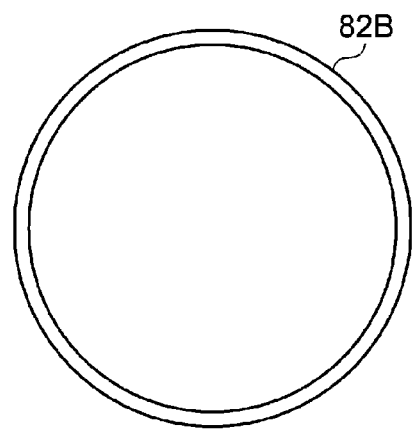
FIG. 12B is a plan view schematically illustrating an exemplary cover member.

As illustrated in FIG. 12A, the film forming unit U3 may have an ultraviolet radiation part 60B instead of the ultraviolet radiation part 60. The ultraviolet radiation part 60B differs from the ultraviolet radiation part 60 in that the former further has a holder 92B configured to support the workpiece W in addition to the holding arm 62, further has a cover member 82B, and further has a lamp driver 94B. The holder 92B may be fixed at a predetermined position, and may be configured to support the workpiece W at that position. The cover member 82B may be provided between the ultraviolet lamp 66 and the holder 92B (the workpiece W supported by the holder 92B). As illustrated in FIG. 12B, the cover member 82B may be a plate member formed in an annular shape so as to cover the peripheral edge portion of the workpiece W. That is, the shape of the cover member 82B viewed in the thickness direction may correspond to the non-removal area Sn. The cover member 82B forms a light-blocking member that blocks ultraviolet rays directed to the non-removal area Sn.

The ultraviolet lamp 66 may be configured to be movable in the horizontal direction. The lamp driver 94B is a horizontal actuator that moves the ultraviolet lamp 66 in the horizontal direction using a power source such as an electric motor. In this case, the controller 100 may cause the ultraviolet lamp 66 to radiate ultraviolet rays to the rear surface Wb (the removal area Sr) by moving the ultraviolet lamp 66 with respect to the workpiece W using the lamp driver 94B. The rear surface Wb may be irradiated with ultraviolet rays while the ultraviolet lamp 66 is moved in the state in which the holding arm 62 supports the workpiece W in the standby position instead of the holder 92B, and the entire area of the rear surface Wb may be irradiated with ultraviolet rays by the ultraviolet lamp 66A. The cover member 82B may be disposed between the holding arm (the holder) configured to hold the workpiece W in the state of not covering at least a portion of the non-removal region Sn and the ultraviolet lamp 66. In the ultraviolet radiation part 60A, by moving the ultraviolet lamp 66 instead of the ultraviolet lamp 66A, ultraviolet rays may be radiated to the entire area of the rear surface Wb.

In the coating and development apparatus 2 according to the modification illustrated in FIG. 12A, the light-blocking member includes separate two members of a holder 92B configured to hold the workpiece W, and the cover member 82B disposed between the holder 92B and the ultraviolet lamp 66. In this case, since the fluororesin film Ff formation range may be adjusted depending on the shape of the cover member 82B, it is possible to simplify the member that holds the workpiece W (e.g., the holder 92B or the holding arm 62).

The non-removal region Sn, in which the fluororesin film Ff is not formed, may be set in an area other than the peripheral edge portion of the rear surface Wb of the workpiece W. For example, instead of the cover member 82B, the cover member 82C illustrated in FIG. 12C may be disposed between the workpiece W and the ultraviolet lamp 66. The cover member 82C may be formed in an annular shape. The cover member 82C may have a width of about ¼ to ⅔ of the radius of the workpiece W from the outer edge in the direction corresponding to the radius of the workpiece W. The cover member 82C covers the outer peripheral portion (the portion excluding the central portion) of the rear surface Wb of the workpiece W, but does not cover the rear surface Wb in a portion of the outer peripheral portion.

Figure 12C:
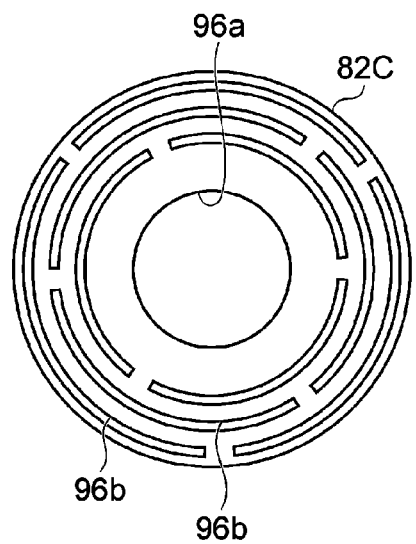
FIG. 12C is a plan view schematically illustrating another exemplary cover member.

The cover member 82C has a plurality of holes 96b penetrating the cover member 82c in the thickness direction in the outer peripheral portion, in addition to the hole 96a in the central portion of an annular shape. The plurality of holes 96b may be formed in a line shape in the circumferential direction, as illustrated in FIG. 12C. Alternatively, the plurality of holes 96b may be formed in a line shape in the radial direction, or may be formed in a dot shape in the outer peripheral portion. In this case, the fluororesin film Ff is formed in the areas corresponding to the hole 96a and the plurality of holes 96b in the rear surface Wb of the workpiece W, and the hydrophobic film Fh remains in the areas corresponding to the portions other than those of the plurality of holes 96b in the outer peripheral portion of the cover member 82C. As a result, it is possible to reduce the friction between the workpiece W and other members owing to the fluororesin film Ff in the central portion of the rear surface Wb and the fluororesin films Ff scatteredly distributed on the outer peripheral portion of the workpiece W. In addition, since a portion of the hydrophobic film Fh remains on the outer peripheral portion of the workpiece W, it is possible to suppress slippage of the workpiece W during transportation.

In the coating and development apparatus 2 illustrated above, the hydrophobizing process and the fluororesin film Ff formation process are performed in a single unit. Therefore, it is possible to continuously and efficiently perform these processes. However, the coating and development apparatus 2 may include a hydrophobizing unit (a hydrophobizing part) configured to perform the hydrophobizing process and a resin-film forming unit (a resin-film forming part) configured to form the fluororesin film Ff, in a separated form. That is, the hydrophobizing process and the fluororesin film Ff formation process may be performed in different processing spaces. In this case, the ultraviolet radiation part 60 may be provided in either the hydrophobizing unit or the resin-film forming unit, and the coating and development apparatus 2 may further include an ultraviolet radiation unit having the ultraviolet radiation part 60.

In the coating and development apparatus 2 illustrated above, the fluororesin film Ff is formed on the rear surface Wb of a workpiece W through vapor deposition of the processing gas for forming the fluororesin film. However, in the coating and development apparatus 2, the fluororesin film may be formed by supplying a processing liquid for forming a fluororesin film to the rear surface Wb.

The ultraviolet radiation unit 60 of the coating and development apparatus 2 illustrated above is configured not to perform radiation of the ultraviolet rays to the non-removal area Sn by blocking ultraviolet rays from the ultraviolet lamp 66. However, the ultraviolet radiation part 60 may have an ultraviolet lamp having a narrowed radiation area. The ultraviolet radiation part 60 may remove the hydrophobic film Fh in the removal area Sr by moving the ultraviolet lamp so as to irradiate only the removal area Sr with ultraviolet rays.

According to the present disclosure, a substrate processing apparatus and a substrate processing method capable of adjusting a fluororesin film formation range in a substrate surface are provided.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
    a hydrophobizing part configured to perform a hydrophobizing process of forming a hydrophobic film on a front surface of a substrate through vapor deposition of a hydrophobizing gas;
    an ultraviolet radiation part configured to radiate ultraviolet rays to a removal area on a rear surface of the substrate so as to remove the hydrophobic film formed in the removal area in the hydrophobizing process;
    a resin-film forming part configured to form a fluororesin film in the removal area after the hydrophobic film is removed;
    a holding arm configured to hold the substrate and to be movable;
    a coating film forming part configured to form a coating film on the front surface of the substrate by supplying a processing liquid to the front surface of the substrate after forming the fluororesin film; and
    a development part configured to perform a development process on the substrate after an exposure process is performed on the coating film,
    wherein the holding arm covers at least a portion of a non-removal area other than the removal area in a state that the holding arm holds the substrate,
    wherein the ultraviolet radiation part is located below a moving line in which the substrate moves between a standby position of the holding arm and a delivery position within the resin-film forming part,
    wherein the removal area is set to an area other than a peripheral edge portion of the rear surface,
    wherein the ultraviolet radiation part comprises:
        an ultraviolet illumination part configured to be capable of radiating the ultraviolet rays to an area including the removal area; and
        a light-blocking member disposed between the ultraviolet illumination part and the rear surface and configured to block the ultraviolet rays radiated to the non-removal area other than the removal area on the rear surface, and
    wherein the light-blocking member includes the holding arm and a cover member disposed between the holding arm and the ultraviolet illumination part.

2. The substrate processing apparatus of claim 1, wherein the hydrophobizing part is configured to supply the hydrophobizing gas into a processing space for performing the hydrophobizing process so as to perform the vapor deposition of the hydrophobizing gas on the front surface, and
    the resin-film forming part is configured to supply a processing gas for forming the fluororesin film into the processing space so as to perform vapor deposition of the processing gas on the rear surface.

3. A substrate processing apparatus comprising:
    a hydrophobizing part configured to perform a hydrophobizing process of forming a hydrophobic film on a front surface of a substrate through vapor deposition of a hydrophobizing gas;
    an ultraviolet radiation part configured to radiate ultraviolet rays to a removal area on a rear surface of the substrate so as to remove the hydrophobic film formed in the removal area in the hydrophobizing process;
    a resin-film forming part configured to form a fluororesin film in the removal area after the hydrophobic film is removed;
    a holding arm configured to hold the substrate and to be movable,
    wherein the holding arm covers at least a portion of a non-removal area other than the removal area in a state that the holding arm holds the substrate,
    wherein the ultraviolet radiation part is located below a moving line in which the substrate moves between a standby position of the holding arm and a delivery position within the resin-film forming part, and
    wherein the ultraviolet radiation part comprises:
        an ultraviolet illumination part configured to be capable of radiating the ultraviolet rays to an area including the removal area; and
        a light-blocking member disposed between the ultraviolet illumination part and the rear surface and configured to block the ultraviolet rays radiated to the non-removal area other than the removal area on the rear surface, and
    wherein the light-blocking member includes the holding arm and a cover member disposed between the holding arm and the ultraviolet illumination part.

4. The substrate processing apparatus of claim 3, wherein the hydrophobizing part is configured to supply the hydrophobizing gas into a processing space for performing the hydrophobizing process so as to perform the vapor deposition of the hydrophobizing gas on the front surface, and
    the resin-film forming part is configured to supply a processing gas for forming the fluororesin film into the processing space so as to perform vapor deposition of the processing gas on the rear surface.

5. The substrate processing apparatus of claim 1, further comprising:
    a chamber configured to form a processing space to which a processing gas is supplied from the resin-film forming part,
    wherein the holding arm and the ultraviolet radiation part are disposed outside the chamber.

6. The substrate processing apparatus of claim 5, wherein the moving line is a direction where the substrate moves toward the delivery position within the processing space.

7. The substrate processing apparatus of claim 5, wherein the cover member is disposed outside the chamber and configured to block a portion of the ultraviolet rays from the ultraviolet radiation part.

8. A substrate processing apparatus comprising:
    a hydrophobizing part configured to perform a hydrophobizing process of forming a hydrophobic film on a front surface of a substrate through vapor deposition of a hydrophobizing gas;

an ultraviolet radiation part configured to radiate ultraviolet rays to a removal area on a rear surface of the substrate so as to remove the hydrophobic film formed in the removal area in the hydrophobizing process;
a resin-film forming part configured to form a fluororesin film in the removal area after the hydrophobic film is removed;
a holding arm configured to hold the substrate and to be movable,
wherein the holding arm covers at least a portion of a non-removal area other than the removal area in a state that the holding arm holds the substrate,
wherein the ultraviolet radiation part is located below a moving line in which the substrate moves between a standby position of the holding arm and a delivery position within the resin-film forming part,
wherein the ultraviolet radiation part includes:
an ultraviolet illumination part configured to be capable of radiating the ultraviolet rays to an area including the removal area; and
a light-blocking member disposed between the ultraviolet illumination part and the rear surface and configured to block the ultraviolet rays radiated to the non-removal area other than the removal area on the rear surface,
wherein the light-blocking member includes:
a holder, which is different from the holding arm, configured to hold the substrate; and
a cover member disposed between the holder and the ultraviolet illumination part, and
wherein the cover member includes:
a central hole penetrating the cover member in a thickness direction of the cover member in a central portion; and
a plurality of peripheral holes penetrating the cover member in the thickness direction in an outer peripheral portion of the central hole.

9. The substrate processing apparatus of claim 1, further comprising a controller configured to move the holding arm holding the substrate, on which the hydrophobic film is formed, from the standby position to the delivery position within the resin-film forming part in a state that an entire area within a circumference of the peripheral edge portion of the rear surface of the substrate is the non-removal area.

* * * * *